(12) United States Patent
Youssefi et al.

(10) Patent No.: US 12,328,948 B1
(45) Date of Patent: Jun. 10, 2025

(54) CIRCUIT AND METHOD FOR CHARGE DEVICE MODEL PROTECTION

(71) Applicant: Cadence Design Systems, Inc., San Jose, CA (US)

(72) Inventors: Bahar Youssefi, Pointe-Claire (CA); David Michael Burnell, Ellicott City, MD (US); Jean-Francois Delage, Montreal (CA); Stephane Leclerc, Anjou (CA); Zheng Lai, Foshan (CN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/860,705

(22) Filed: Jul. 8, 2022

(51) Int. Cl.
  *H10D 89/60* (2025.01)
  *H02H 9/04* (2006.01)

(52) U.S. Cl.
  CPC .......... *H10D 89/819* (2025.01); *H02H 9/046* (2013.01)

(58) Field of Classification Search
  CPC .............................. H01L 27/0285; H02H 9/046
  USPC ........................................................... 361/56
  See application file for complete search history.

(56) References Cited

U.S. PATENT DOCUMENTS

| | | | |
|---|---|---|---|
| 7,336,459 B2* | 2/2008 | Chen | H10D 89/811 361/111 |
| 7,787,227 B1* | 8/2010 | Terrovits | H03F 3/195 361/111 |
| 7,839,612 B1* | 11/2010 | Chan | H10D 89/819 361/56 |
| 8,094,422 B2* | 1/2012 | Sasaki | H01L 23/60 361/56 |
| 8,830,640 B2* | 9/2014 | Taghizadeh Kaschani | H02H 9/046 361/56 |
| 9,013,845 B1* | 4/2015 | Karp | H02H 9/041 361/91.1 |
| 9,368,485 B1* | 6/2016 | Chu | H10D 89/921 |
| 11,176,985 B1* | 11/2021 | Nam | G06F 11/3062 |
| 11,689,014 B2* | 6/2023 | Krishnamoorthy | H10D 89/611 361/111 |
| 2003/0011949 A1* | 1/2003 | Ker | H10D 89/811 361/56 |
| 2009/0323236 A1* | 12/2009 | Morishita | H03K 19/00315 361/56 |
| 2010/0254051 A1* | 10/2010 | Jeon | H02H 9/046 361/56 |
| 2012/0236444 A1* | 9/2012 | Srivastava | H02M 1/32 361/56 |
| 2015/0124359 A1* | 5/2015 | Cao | H02H 9/043 361/56 |
| 2015/0138679 A1* | 5/2015 | Venkatasubramanian | H02H 9/046 361/56 |
| 2015/0155707 A1* | 6/2015 | Truong | H02H 9/046 361/56 |
| 2015/0270258 A1* | 9/2015 | Dabral | H10D 89/819 361/56 |

(Continued)

*Primary Examiner* — Dharti H Patel
(74) *Attorney, Agent, or Firm* — Mark H. Whittenberger; Holland & Knight LLP (57) ABSTRACT

Embodiments included herein are directed towards a charge device model ("CDM") protection circuit. The circuit may include a power supply, a power clamp operatively connected to the power supply, at least one diode connected with the power clamp, a field effect transistor ("FET") operatively connected with the at least one diode and a trigger mechanism configured to activate the FET.

12 Claims, 11 Drawing Sheets

(56) References Cited

U.S. PATENT DOCUMENTS

| | | | |
|---|---|---|---|
| 2015/0311700 A1* | 10/2015 | Lee | H02H 9/04 |
| | | | 361/56 |
| 2015/0380397 A1* | 12/2015 | Dabral | H10D 89/611 |
| | | | 361/56 |
| 2017/0126003 A1* | 5/2017 | Henzler | H02H 9/046 |
| 2017/0302066 A1* | 10/2017 | Gao | H03K 5/08 |
| 2018/0012886 A1* | 1/2018 | Mozak | H10D 89/611 |
| 2020/0395935 A1* | 12/2020 | Bergsma | H10D 89/601 |
| 2021/0391703 A1* | 12/2021 | Dua | H02H 9/046 |
| 2022/0158447 A1* | 5/2022 | Uemura | H10D 89/611 |
| 2022/0294213 A1* | 9/2022 | Gao | H10D 89/811 |
| 2022/0320856 A1* | 10/2022 | Sakai | H02H 9/046 |
| 2023/0148160 A1* | 5/2023 | Sivakumar | H02H 9/046 |
| | | | 361/56 |
| 2023/0352932 A1* | 11/2023 | Li | H02H 9/046 |
| 2024/0250526 A1* | 7/2024 | Ahammed | H10D 89/611 |

\* cited by examiner

CIRCUIT AND METHOD FOR CHARGE DEVICE MODEL PROTECTION

FIELD OF THE INVENTION

The present disclosure relates to electronic circuit, and more particularly, to a circuit and method for charge device model protection.

BACKGROUND

Electrostatic discharge ("ESD") is the transient discharge of electrostatic charges due to human handling, transportation, assembly process areas, and field applications. ESD is one of the most common causes of all integrated circuit failures in the field. Joint Electron Device Engineering Council ("JEDEC") standards introduce required ESD tests to qualify effectiveness and reliability of ESD protection methods. The two main test models for ESD are the human body model ("HBM") and the charge device model ("CDM"). Over 99% of all ESD and overstress part failures in the field (after packaging) are CDM failures.

SUMMARY

In one or more embodiments of the present disclosure, a charge device model ("CDM") protection circuit is provided. The circuit may include a power supply, a power clamp operatively connected to the power supply, at least one diode connected with the power clamp, a field effect transistor ("FET") operatively connected with the at least one diode and a trigger mechanism configured to activate the FET.

One or more of the following features may be included. The FET may include a pulldown n-channel metal-oxide semiconductor ("nMOS"). The FET may include a pullup p-channel metal-oxide semiconductor ("pMOS"). The trigger mechanism may include a resistor/capacitor ("RC") network. The circuit may include an inverter configured to receive an input from the RC network.

In one or more embodiments of the present disclosure, a charge device model ("CDM") protection method is provided. The method may include providing a power supply, a power clamp operatively connected to the power supply, at least one diode connected with the power clamp, a field effect transistor ("FET") operatively connected with the at least one diode, a trigger mechanism configured to activate the FET, and a series impedance connected with at least one victim device. The method may further include receiving a current at the at least one diode and the power clamp, holding an inverter input to ground via a capacitor, pulling up an output of the inverter, grounding the at least one diode and reducing a maximum voltage provided to a victim device based upon, at least in part, the grounded at least one diode.

One or more of the following features may be included. The FET may include a pulldown n-channel metal-oxide semiconductor ("nMOS") and/or a pullup p-channel metal-oxide semiconductor ("pMOS"). The trigger mechanism may include a resistor/capacitor ("RC") network. The method may include receiving an input from the RC network at an inverter. A gate of the inverter may be held high using a resistor during normal operation. The inverter may be powered via the power supply.

In one or more embodiments of the present disclosure, a charge device model ("CDM") protection circuit is provided. The circuit may include a power supply, a power clamp operatively connected to the power supply, a first set of diodes connected with the power clamp, a second set of diodes connected with the first set of diodes, a field effect transistor ("FET") operatively connected with the second set of diodes, and a trigger mechanism configured to activate the FET.

One or more of the following features may be included. The FET may include a pulldown n-channel metal-oxide semiconductor ("nMOS") or a pullup p-channel metal-oxide semiconductor ("pMOS"). The trigger mechanism may include a resistor/capacitor ("RC") network. The method may include receiving an input from the RC network at an inverter. A gate of the inverter may be held high using a resistor during normal operation. The inverter may be powered via the power supply. The power clamp may be an active power clamp. The first set of diodes and the second set of diodes may be connected through a secondary impedance. The second set of diodes may be operatively connected to a different power supply than the first set of diodes.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Like reference numerals in the drawings denote like elements.

Figure 1:
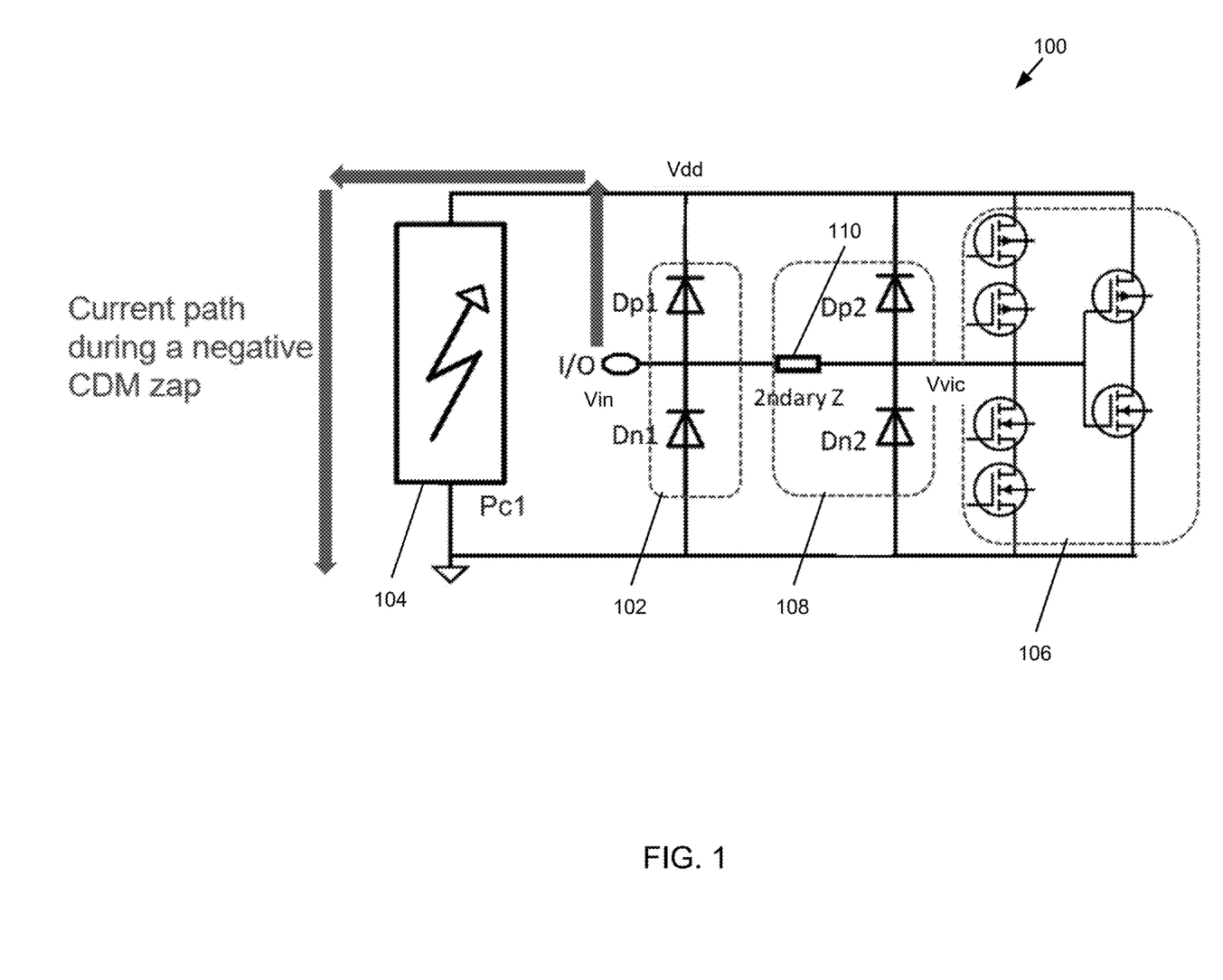
FIG. 1 is an example circuit consistent with embodiments of the present disclosure.

Referring now to FIG. 1, a circuit 100 consistent with embodiments of the present disclosure is provided. An ESD protection scheme must create a current path to discharge electrostatic charges during an ESD event. These protection schemes should not affect the performance of the circuit it is protecting and should be OFF during normal operation and ON only during an ESD event. ESD protection devices add parasitic capacitance to the signal pads and undesirably affect the performance of high-speed mixed-signal and RF circuits. FIG. 1 depicts a general protection circuit 100 that includes human body model ("HBM") primary diodes 102 (shown in FIG. 1 as Dp1/Dn1) and clamp 104 that together define the voltage at I/O (Vin). Secondary protection reduces the voltage seen by victim devices 106 (Vvic) using voltage division between a smaller pair of diodes 108 (shown in FIG. 1 as Dp2/Dn2) and a series impedance 110 (shown in FIG. 1 as 2ndary Z) located in the signal path.

High frequency, linearity and bandwidth requirements can severely limit the amount of resistance and capacitance that can be added to the signal line. Making diodes larger increases the capacitance. Reducing the secondary resistance below 50Ω requires using larger secondary diodes to maintain effectiveness. In this example, the minimum victim voltage limited to 'Vdd+Von' (where Von is the diode turn on voltage, ~1.0V) and Vdd is the maximum CDM voltage across clamp 104 on the Vdd node. This may still be too high in many cases in high speed paths to protect the receivers (victims) 106. This is especially true in technologies that feature nanometer range gate lengths.

The need for smaller primary diodes is unavoidable as the frequency goes higher. This weakens ESD protection and reduces the level of CDM current that an integrated circuit ("IC") can tolerate. This may increase the chance of failure in the field. As technology moves to smaller feature sizes and thinner dielectrics the ESD vulnerability increases. The ESD breakdown voltage where damage occurs is moving lower, which makes circuits more difficult to protect using standard techniques. This means smaller primary diodes would create more ESD failures compared to larger nodes.

ESD failure results when the voltage across one of the elements (victims) between the IO signal node and power and ground exceeds the gate oxide breakdown or drain/source diffusion breakdown limits. Diffusion breakdown may occur when the drain/source of a transistor is connected to the signal pad. Gate oxide breakdown may occur when the gate of a transistor is connected to the signal pad. An approach that stacks victim elements may be used to distribute the voltage over several elements reducing the worst-case stress over any one element. However, stacking has the negative consequences of increasing area, reducing performance and reducing voltage headroom. Keeping stacking to a minimum is required for competitiveness and successful operation. Gate oxide breakdown voltage limits continue to decrease as technology moves to lower nodes. Failure voltage limits may correlate with gate oxide thickness. CDM negative zaps (where the signal I/O pad voltage is high with respect to ground) cause most of the failures as the victim devices between the pad and ground see higher voltages in those situations. Gate oxide breakdown/soft failure often occurs during a negative CDM zap. To address the susceptibility of gate oxide to ESD failure, secondary schematic protection is required.

Figure 2:
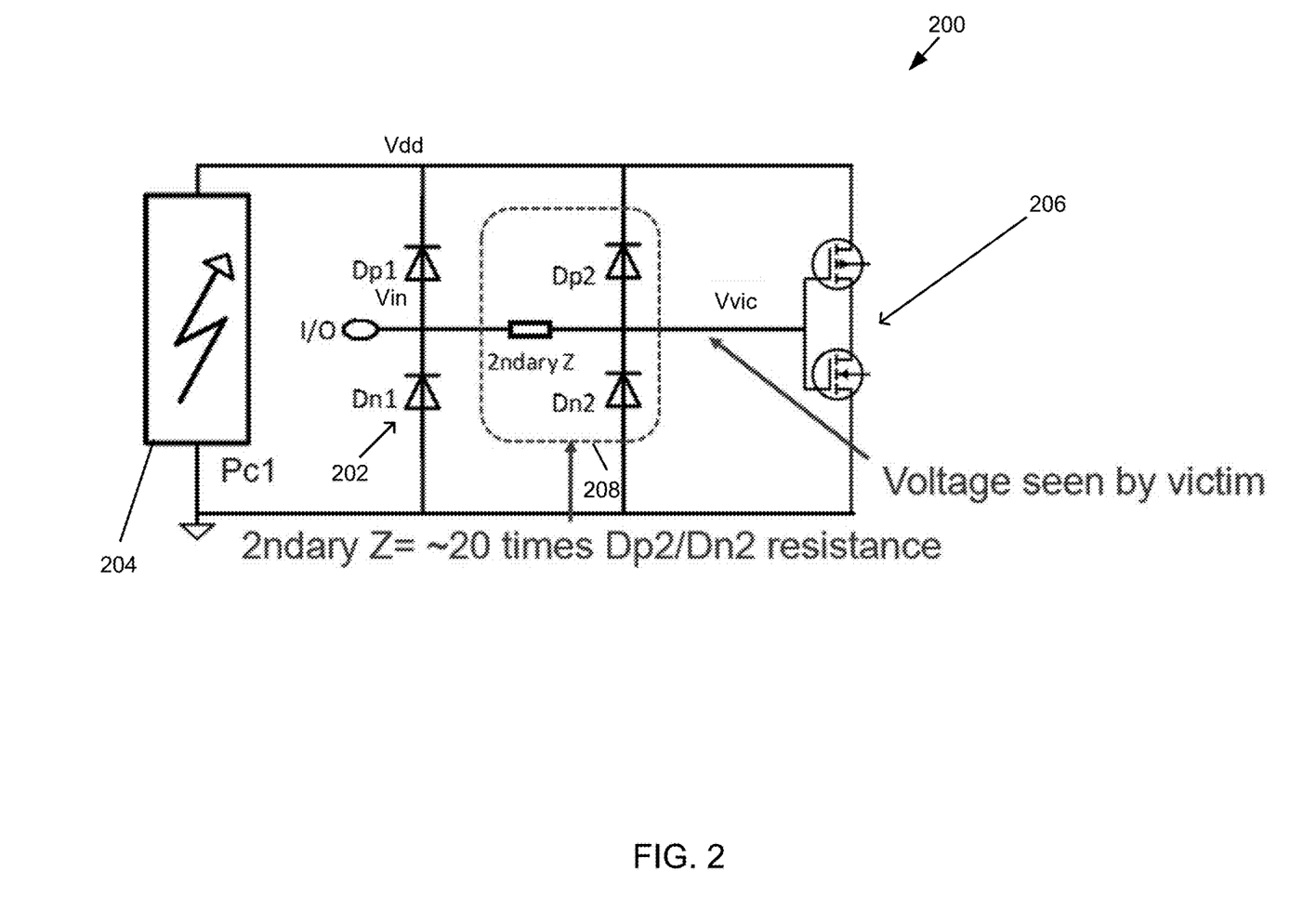
FIG. 2 is an example circuit consistent with embodiments of the present disclosure.

Referring now to FIG. 2, a circuit 200 consistent with embodiments of the present disclosure is provided. Secondary schematic protection reduces the part of the voltage developed across the HBM primary diodes by virtue of voltage division. The resistance of secondary diodes 208 should be 10×~20× smaller than the secondary series impedance to get a significant voltage division effect. Increasing secondary protection diodes 208 reduces their resistance at the expense of higher capacitive loading which in turn affects both the insertion and return losses in receivers. Conversely, higher secondary series impedances can cause unacceptable signal path bandwidth limitations.

Figure 3:
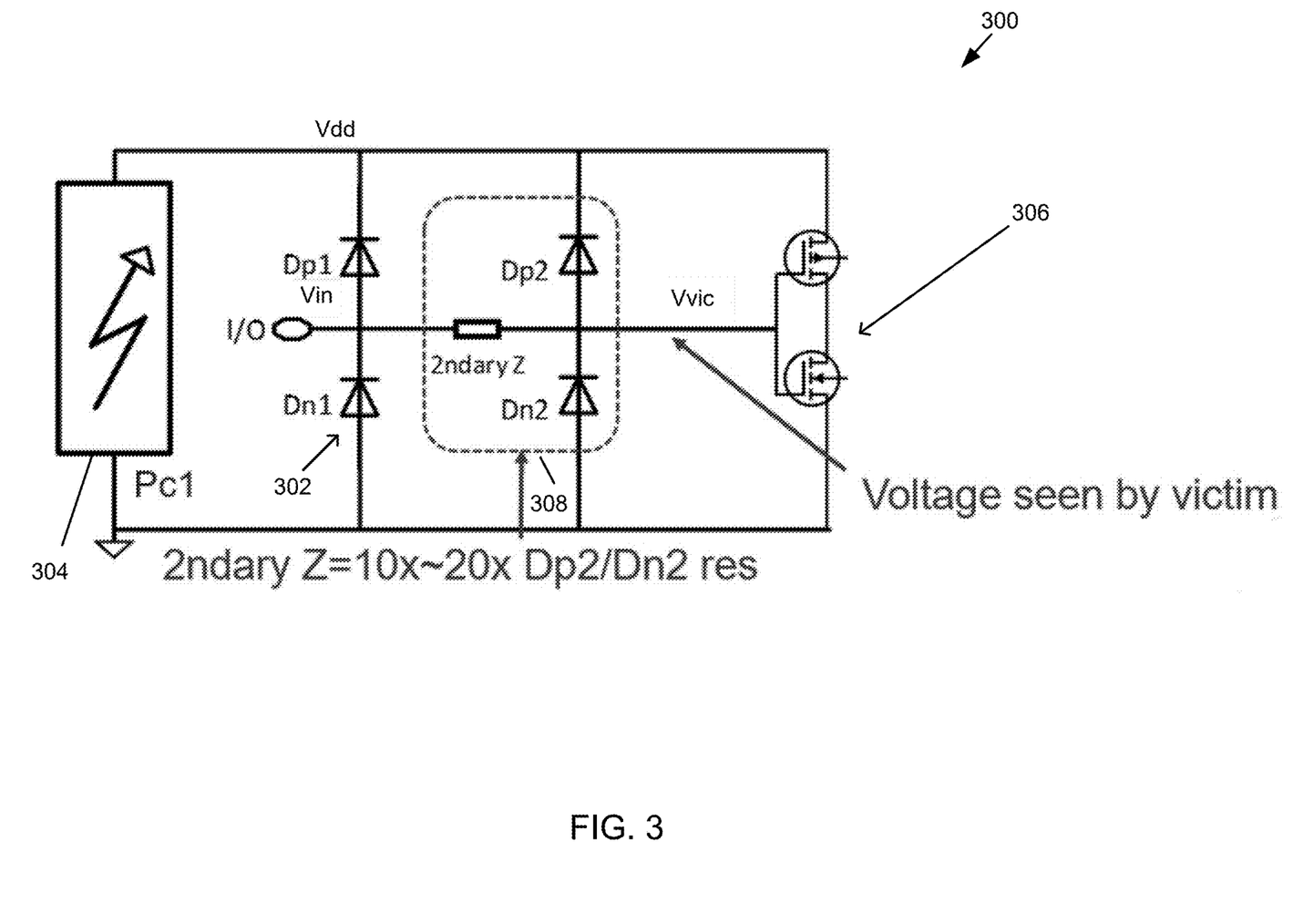
FIG. 3 is an example circuit consistent with embodiments of the present disclosure.

Referring now to FIG. 3, a circuit 300 consistent with embodiments of the present disclosure is provided. As CDM currents increase, secondary protections cannot reduce the victim voltage enough to prevent gate oxide breakdown. Indeed, the voltage seen at the victim may be indicated by:

$$\text{Vvic} = V(Dp2) + Vdd \qquad \text{Equation 1}$$

where 'V (Dp2)' is the turn on voltage of Dp2 since the minimum current is flowing through it. And Vdd in this example refers to the maximum clamp voltage that occurs on the Vdd node during a CDM event.

Figure 4:
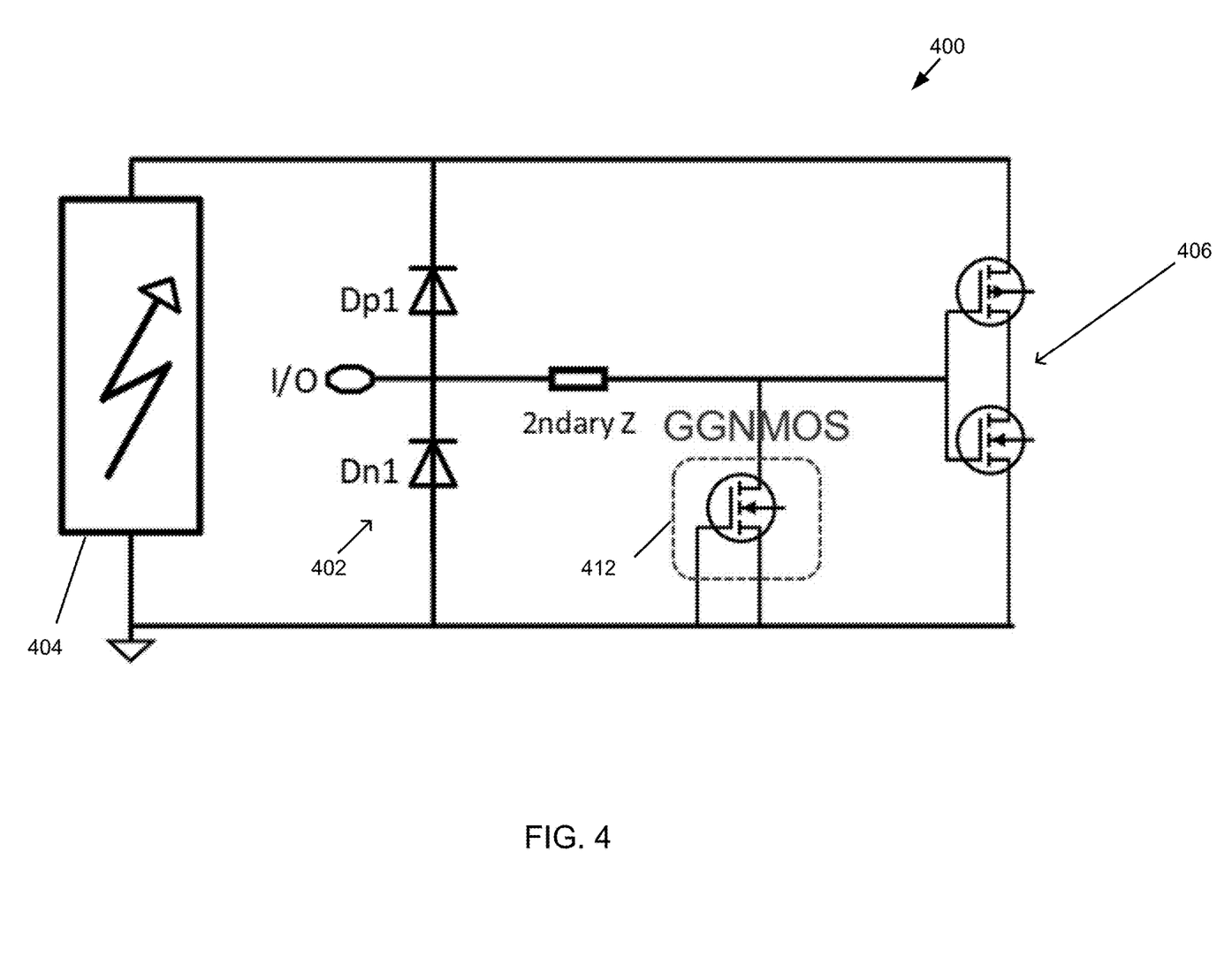
FIG. 4 is an example circuit consistent with embodiments of the present disclosure.

Referring now to FIG. 4, a circuit 400 consistent with embodiments of the present disclosure is provided. Gate grounded NMOS ("GGNMOS") protection 412 has been used as a replacement for secondary diodes to deal with secondary impedance limitations. During a CDM event, avalanche breakdown may occur in the drain-substrate junction of a gate grounded NMOS whose drain is tied to the signal path. At that point, the parasitic bipolar junction transistor ("BJT") of this NMOS turns on, which results in snapback of the current-voltage characteristic. When snapback occurs, the voltage seen by the victims decreases.

Figure 5:
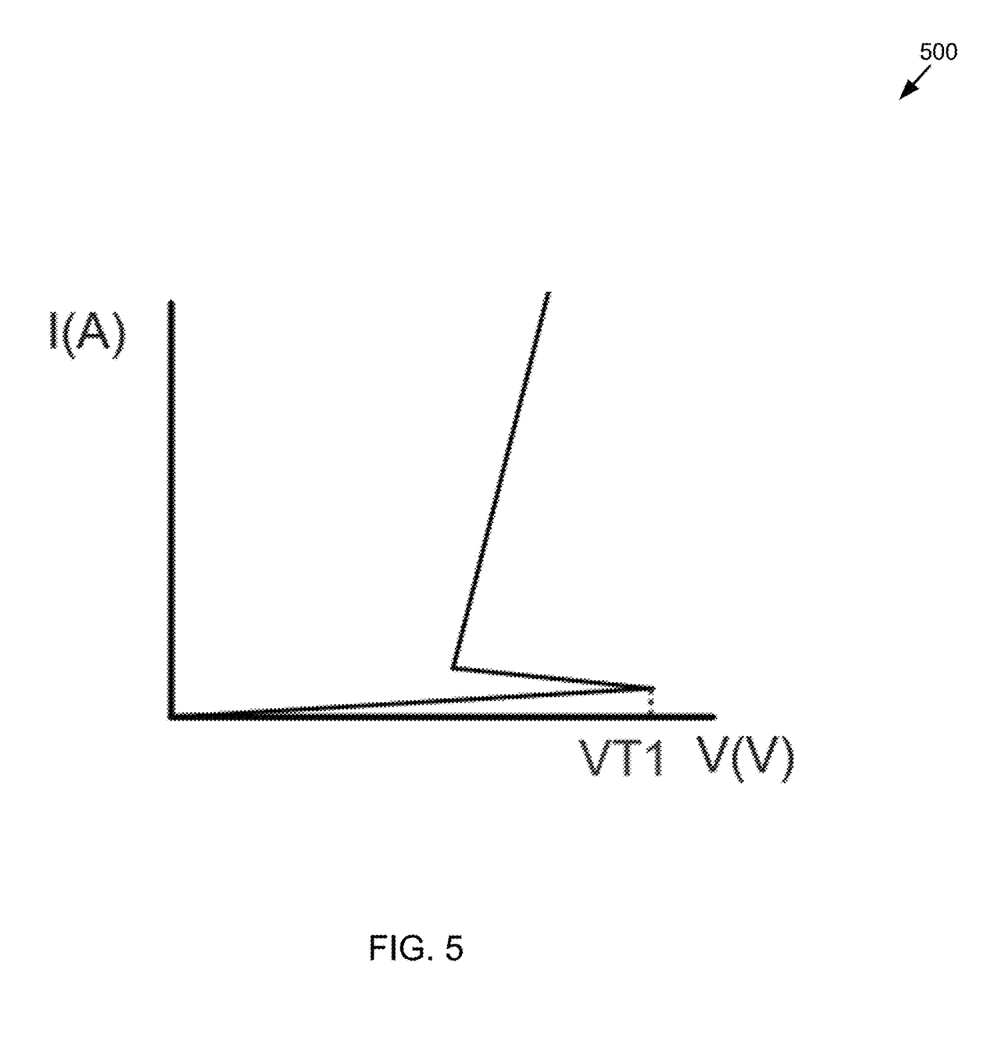
FIG. 5 is a plot of voltage versus current consistent with embodiments of the present disclosure.

GGNMOS protections suffer from several limitations. As shown in FIG. 5, voltage VT1 must be reached before the snapback mechanism kicks in. VT1 may be higher than the victim breakdown voltage, hence the protection may be insufficient. Due to uniformity issues and random variations in processes, VT1 may vary too much from device to device to offer reliable protection. These structures may not be allowed to use core transistors in advanced processes as the GGNMOS protection itself might break (e.g., It2 is too small to handle the current through 2ndaryZ). Thick oxide devices typically exhibit higher VT1 values, making them less effective.

Figure 6:
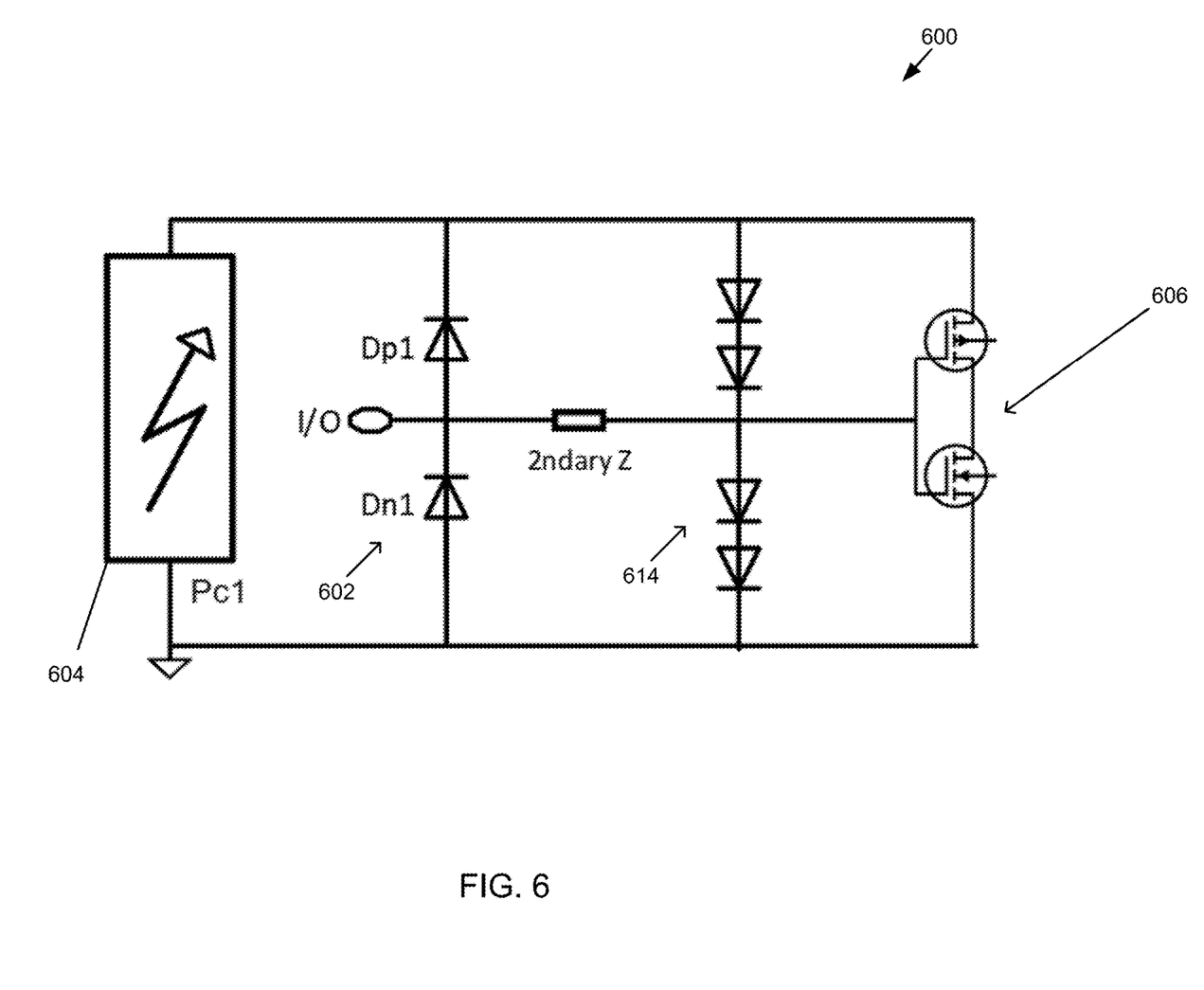
FIG. 6 is an example circuit consistent with embodiments of the present disclosure.

Referring now to FIG. 6, a circuit 600 consistent with embodiments of the present disclosure is provided. Circuit 600 shows a stack of forward-biased diodes 614. Leakage is an issue for this topology which can vary widely across Process, Voltage and Temperature conditions. Leakage is likely to affect the linearity of receivers and can impair the performance of high-speed receivers. Under certain conditions, eliminating stray Vdd to ground currents may prove difficult with this structure and require stacking more diodes which then render the ESD protection less effective.

Figure 7:
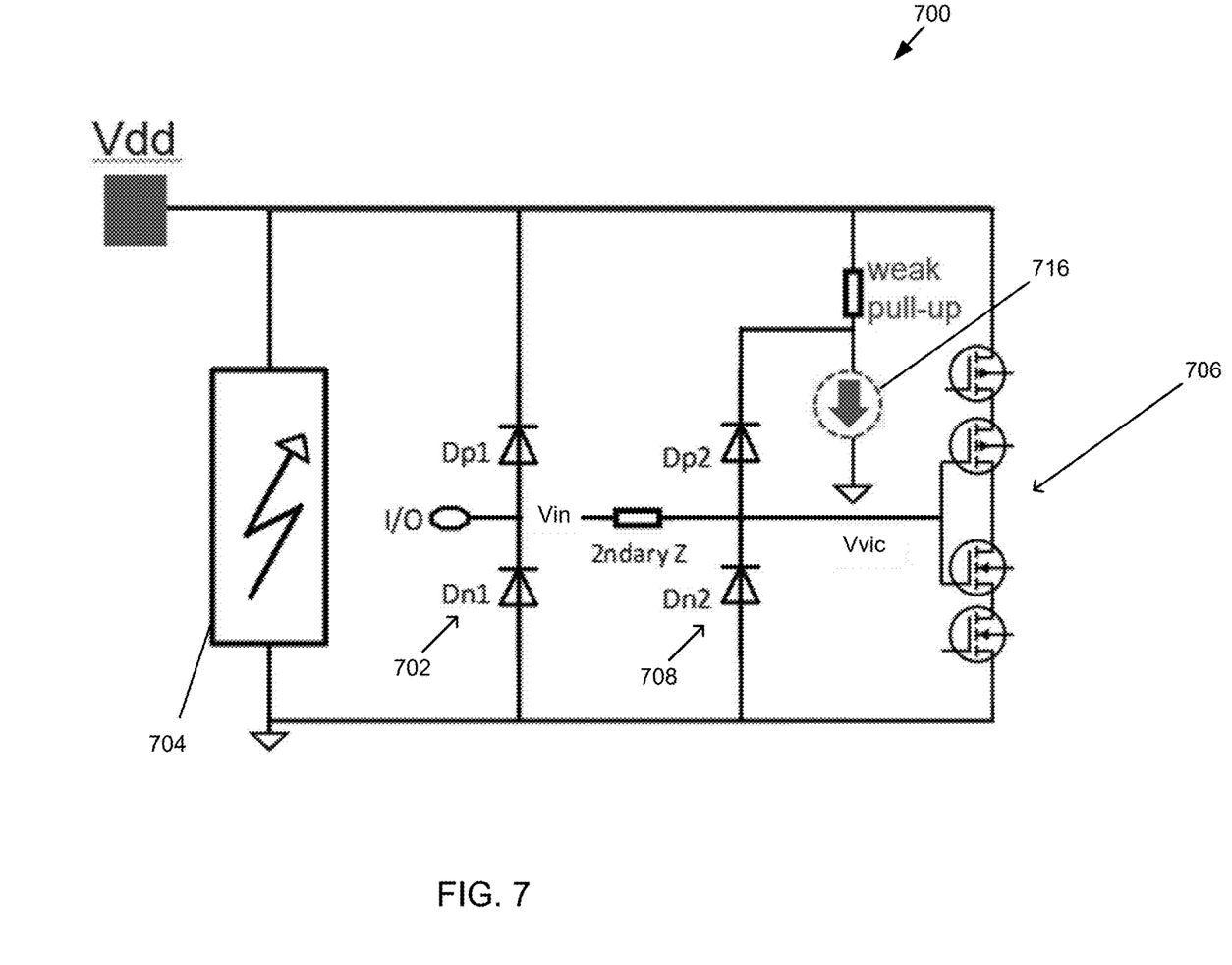
FIG. 7 is an example circuit consistent with embodiments of the present disclosure.

Referring now to FIG. 7, a circuit 700 consistent with embodiments of the present disclosure is provided. Circuit 700 provides better protection against negative CDM zaps without adding extra capacitance to the high-speed signal net. In this example, with respect to diodes 708, Dp2's cathode may be pulled to ground by means of a secondary pull-down clamp 716 during a CDM ESD event. It is weakly pulled up to Vdd during normal circuit operation and operates in its reverse-biased region. During a CDM event, the voltage seen by the victim becomes:

$$Vvic = V(Dp2) + VA1 \quad \text{Equation 2}$$

where VA1 is much smaller than "Vdd" which occurs in the design shown in FIG. 3 when Dp2 is tied directly to the Vdd node. It should be noted that in this example "Vdd" refers to the maximum voltage of the Vdd node defined by the clamp in a CDM event.

Referring now to FIGS. 8-11, various circuits consistent with embodiments of the present disclosure are provided. Two secondary clamp implementations are proposed below. One is an active clamp using a pull-down FET and a trigger mechanism to turn it on. Additionally or alternatively, a passive clamp using a capacitor to absorb the secondary ESD charge may be used as are discussed in further detail hereinbelow.

Figure 8:
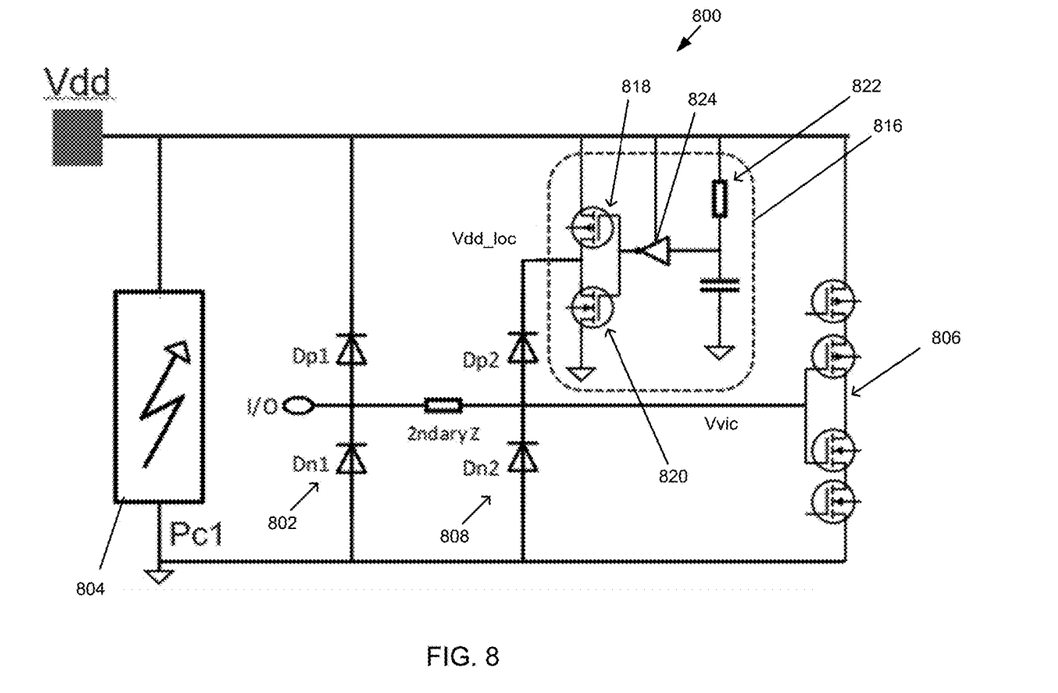
FIG. 8 is an example circuit consistent with embodiments of the present disclosure.

Referring now to FIG. 8, a circuit 800 consistent with embodiments of the present disclosure is provided. Circuit 800 uses an active clamp 804 scheme based on a strong pull-down NMOS 818, a weak pull-up PMOS 820, an inverter 824, and a trigger mechanism 822 to switch its state. Trigger mechanism 822 may include an RC network tied to the input of inverter 824 which is itself powered through the main supply.

During an ESD event, the main Vdd supply goes high by virtue of the ESD current flowing through Dp1 with respect to diodes 802 and the main (Pc1) power clamp 804. The input of inverter 824 may be held to ground through a capacitor. The output of inverter 824 sees its output pulled-up through its internal PMOS device 820. The gate of NMOS 818 may then be pulled to Vdd, which pulls net vdd_loc to ground, grounding the cathode of protection diode Dp2 of diodes 808. The maximum voltage seen by victim 806 becomes 'Vvic=Dp2+VA1', where 'VA1' is typically much smaller than when Dp2 is tied directly to Vdd.

During normal operation (i.e., when power is present), the gate of the triggering inverter 824 may be held high through the resistor of the RC network. The output of triggering inverter 824 is low and vdd_loc may be pulled high through a weak pull-up PMOS device 820. The p-channel may pull up the vdd_loc towards vdd during normal operation. This particular configuration provides a number of advantages over existing approaches. It achieves lower Vvic values than those of a GGNMOS and doesn't exhibit any of its drawbacks. This approach also does not result in any increase of IO (signal) leakage current during normal operation. While a secondary clamp 816 requires a significant amount of area, it is still smaller than a primary clamp and can be shared amongst devices hooked to the same local power domain. It remains effective for much smaller secondary impedance (e.g., "2ndaryZ") than can be used for the standard approach when Dp2 is tied to Vdd; such smaller secondary impedances are essential to implementing higher frequency IOs.

Figure 9:
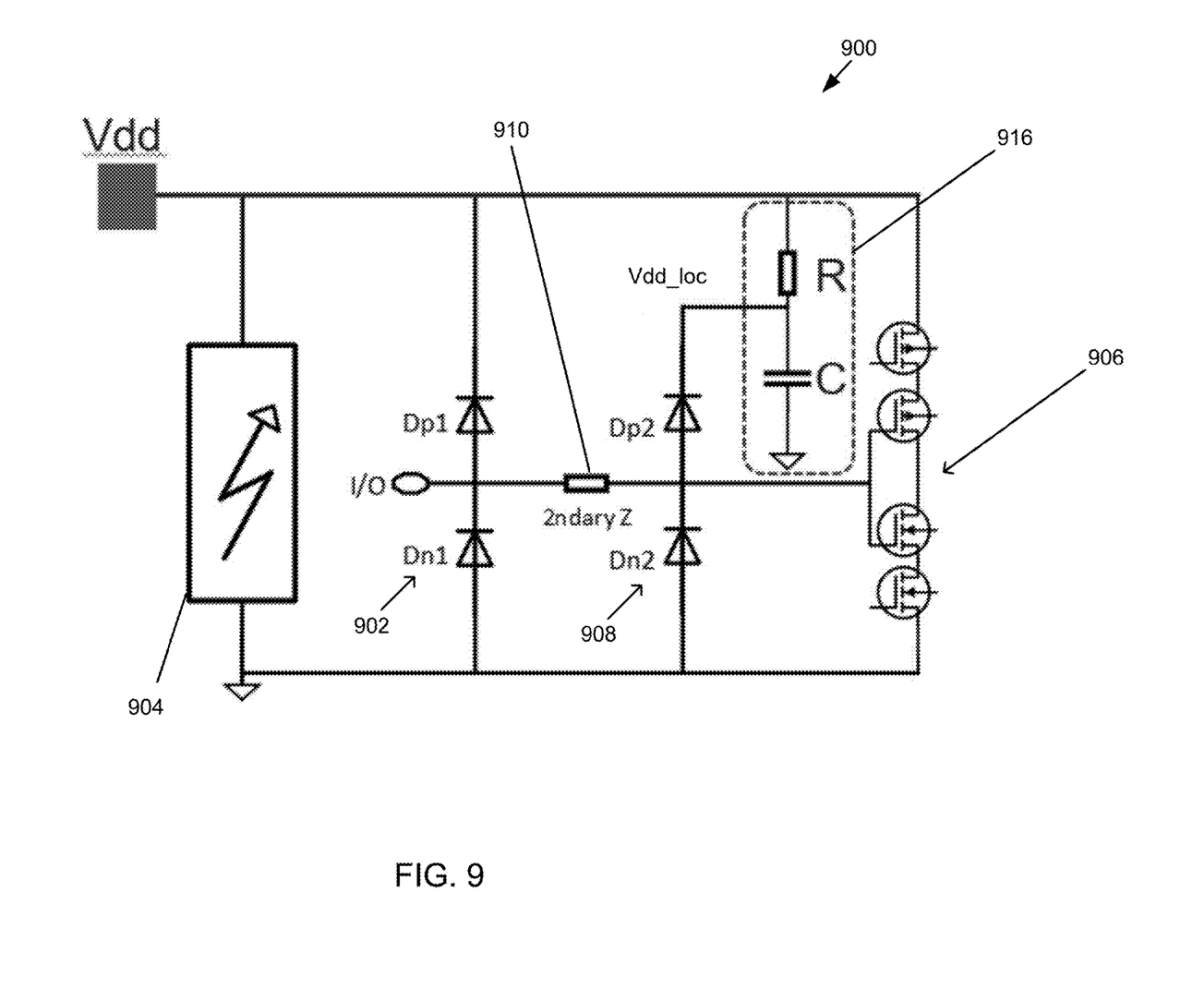
FIG. 9 is an example circuit consistent with embodiments of the present disclosure.
Figure 10:
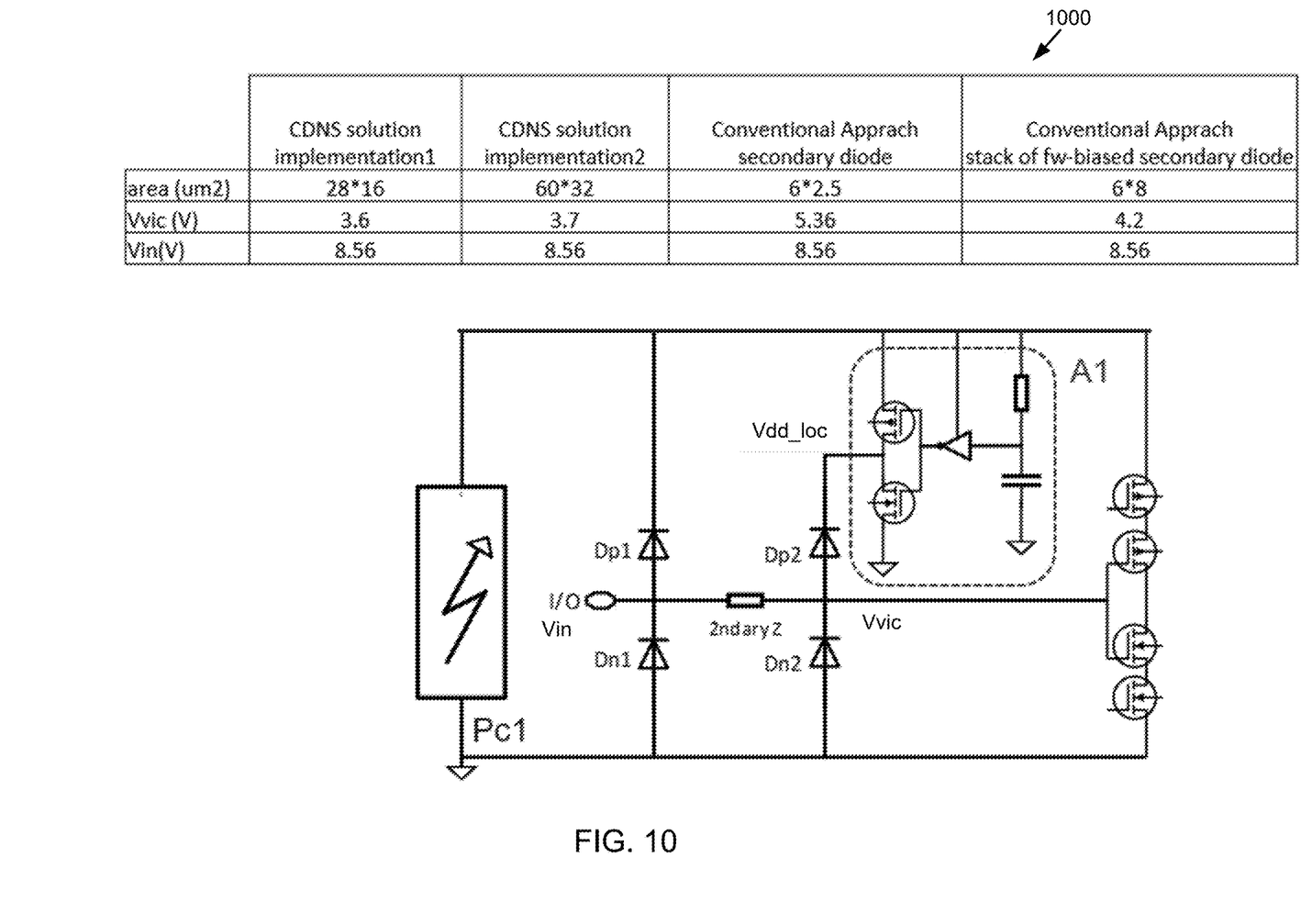
FIG. 10 is an example circuit consistent with embodiments of the present disclosure.

Referring now to FIG. 9, a circuit 900 consistent with embodiments of the present disclosure is provided. Circuit 900 uses a passive clamping scheme based on a capacitor that stores part of the energy from the ESD zap. In operation, and during an ESD zap, current flowing through the secondary impedance 910 also flows through Dp2 of diodes 908. This current then charges up storage capacitor C. The maximum voltage seen by victim 906 becomes 'Vvic=Dp2+VC', where 'VC' increases over time as C gets charged up. By making C and secondary impedance 910 (2ndaryZ) large enough, 'Vvic' can stay low during the entire CDM event. After the CDM zap, Vdd recesses back to ground and C slowly discharges towards ground as well through R. During normal operation (i.e. when power is present), Vdd_loc may be held to Vdd through the weak pull-up resistor R, and Dp2 of diodes 908 may be biased in such a way that it does not interfere with the normal circuit's operation. In some cases, the embodiment depicted in FIG. 8 may be preferred as it features smaller R and C components than that of FIG. 9 as its capacitor may be much smaller because it is directly not in the ESD current path. The diode stays shorted to ground as long as the timer keeps the FET pulldown on, therefore the voltage across the secondary power clamp 816 does not change much throughout the duration of the zap. FIG. 10 shows an area and voltage comparison between the aforementioned options given a 6A CDM zap and a 2ndaryZ made of a 8 pF capacitance.

Figure 11:
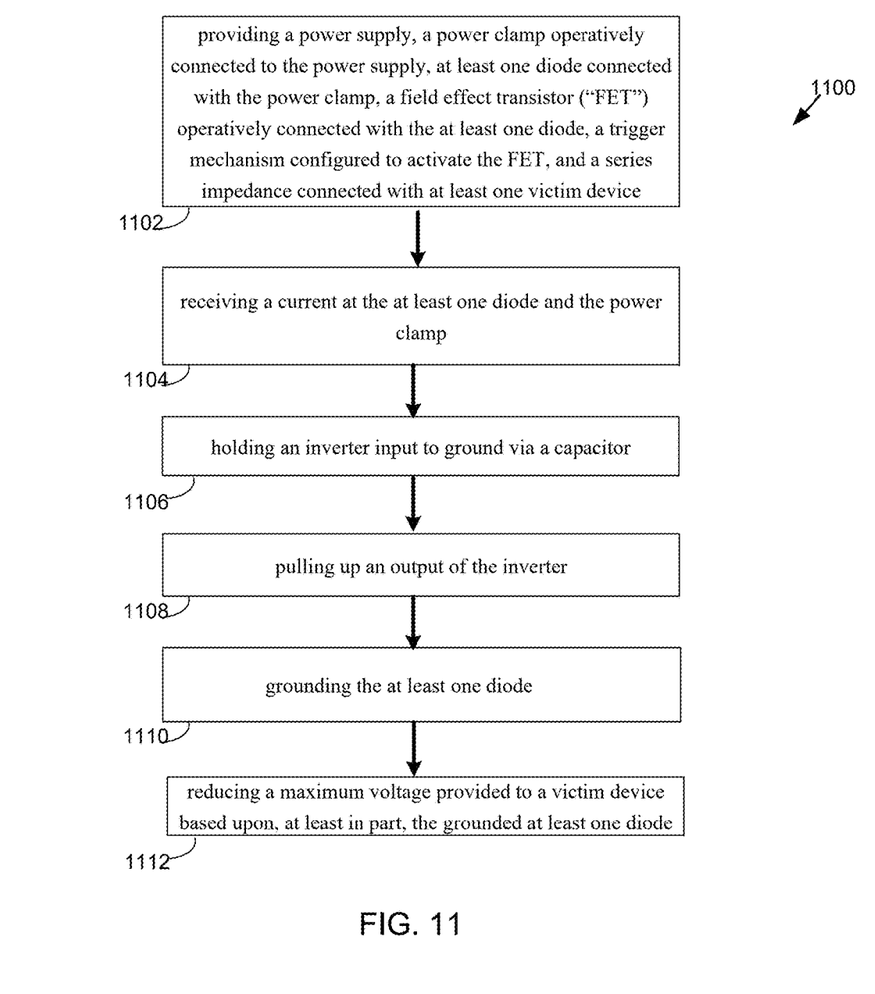
FIG. 11 is an example flowchart according to an embodiment of the present disclosure.

Referring now to FIG. 11, a flowchart 1100 showing operations consistent with embodiments of the present disclosure is provided. Flowchart 1100 depicts a charge device model ("CDM") protection process. The process may include providing 1102 a power supply, a power clamp operatively connected to the power supply, at least one diode connected with the power clamp, a field effect transistor ("FET") operatively connected with the at least one diode and a trigger mechanism configured to activate the FET. The method may further include receiving 1104 a current at the at least one diode and the power clamp, holding 1106 an inverter input to ground via a capacitor, pulling 1108 up an output of the inverter, grounding 1110 the at least one diode and reducing 1112 a maximum voltage provided to a victim device based upon, at least in part, the grounded at least one diode. Numerous other operations are also within the scope of the present disclosure.

It will be apparent to those skilled in the art that various modifications and variations can be made in embodiments of the present disclosure without departing from the spirit or scope of the invention. Thus, it is intended that embodiments of the present disclosure cover the modifications and variations of this invention provided they come within the scope of the appended claims and their equivalents.

What is claimed is:
1. A charge device model ("CDM") protection circuit comprising:
   a power supply;
   a primary power clamp operatively connected to the power supply;
   at least one diode from a first set of diodes connected with the primary power clamp;
   a second set of diodes operatively connected with the first set of diodes; and
   a secondary power clamp operatively connected with at least one diode from the second set of diodes, wherein the secondary power clamp occupies less surface area than the primary power clamp, the secondary power clamp including:
      a field effect transistor ("FET") configured to vary an amplitude of an output voltage, wherein the FET includes a pulldown n-channel metal-oxide semiconductor ("nMOS") and a pullup p-channel metal-oxide semiconductor ("pMOS"), wherein the at least one diode from the second set of diodes is connected to the secondary power clamp at a node disposed between the pulldown nMOS and the pullup pMOS, such that the at least one diode from the second set of diodes is in position to regulate a voltage level between the pulldown nMOS and the pullup pMOS, a trigger mechanism configured to activate the FET, wherein the trigger mechanism includes a resistor/capacitor ("RC") network, and a triggering inverter configured to receive an input from the RC network, wherein the input of the triggering inverter is held to ground via a capacitor of the RC network.

2. A charge device model ("CDM") protection method comprising:

providing a power supply, a primary power clamp operatively connected to the power supply, at least one diode from a first set of diodes connected with the primary power clamp, a second set of diodes operatively connected with the first set of diodes; a secondary power clamp operatively connected with at least one diode from the second set of diodes, wherein the secondary power clamp occupies less surface area than the primary power clamp, the secondary power clamp including a field effect transistor ("FET") configured to vary an amplitude of an output voltage, a trigger mechanism configured to activate the FET, wherein the trigger mechanism includes a resistor/capacitor ("RC") network, and a series impedance connected with at least one victim device, wherein the FET includes a pull-down n-channel metal-oxide semiconductor ("nMOS") and a pullup p-channel metal-oxide semiconductor ("pMOS"), wherein the at least one diode from the second set of diodes is connected to the secondary power clamp at a node disposed between the pulldown nMOS and the pullup pMOS;

receiving a current at the at least one diode and the primary power clamp;

holding a triggering inverter input to ground via a capacitor of the RC network;

pulling up an output of the triggering inverter;

grounding the at least one diode; and reducing a maximum voltage provided to the at least one victim device based upon, at least in part, the grounded at least one diode, wherein the secondary power clamp further includes a triggering inverter configured to receive an input from the RC network, wherein the input of the triggering inverter is held to ground via the capacitor of the RC network.

3. The CDM protection method of claim 2, further comprising:

receiving an input from the RC network at an inverter.

4. The CDM protection method of claim 2, wherein a gate of the inverter is held high using a resistor during normal operation.

5. The CDM protection method of claim 2, wherein the inverter is powered via the power supply.

6. A charge device model ("CDM") protection circuit comprising:

a power supply;

a primary power clamp operatively connected to the power supply;

a first set of diodes connected with the primary power clamp;

a second set of diodes connected with the first set of diodes;

a secondary power clamp operatively connected with the second set of diodes, wherein the secondary power clamp occupies less surface area than the primary power clamp, the secondary power clamp including:

a capacitor configured to receive and store a portion of excess charge after passing through at least one diode from the second set of diodes, and a resistor operatively connected to the capacitor, wherein the resistor is configured to control the rate of discharge of the capacitor, wherein the at least one diode from the second set of diodes is connected to the secondary power clamp at a node disposed between the capacitor and the resistor.

7. The CDM protection circuit of claim 6, wherein the CDM circuit has two modes of operation, a normal mode and an electrostatic discharge (ESD) mode.

8. The CDM protection circuit of claim 7, wherein at least one diode from the second set of diodes is configured to have a reversed bias when operating in the normal mode.

9. The CDM protection circuit of claim 7, wherein the power supply decreases towards ground and the capacitor discharges towards ground through the resistor when operating in the ESD mode.

10. The CDM protection circuit of claim 6, wherein the resistor holds a voltage level inside the secondary power clamp to be equal to the power supply when operating in the normal mode.

11. The CDM protection circuit of claim 6, wherein the first set of diodes and the second set of diodes are connected through a secondary impedance.

12. The CDM protection circuit of claim 6, wherein the second set of diodes are operatively connected to a different power supply than the first set of diodes.

* * * * *